(12) United States Patent
Kim et al.

(10) Patent No.: US 7,977,178 B2
(45) Date of Patent: Jul. 12, 2011

(54) ASYMMETRIC SOURCE/DRAIN JUNCTIONS FOR LOW POWER SILICON ON INSULATOR DEVICES

(75) Inventors: Seong-Dong Kim, LaGrangeville, NY (US); Zhijiong Lou, Carmel, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 12/395,904

(22) Filed: Mar. 2, 2009

(65) Prior Publication Data

US 2010/0219450 A1    Sep. 2, 2010

(51) Int. Cl.
*H01L 21/336* (2006.01)
*H01L 21/8234* (2006.01)

(52) U.S. Cl. ........ 438/197; 438/141; 438/311; 438/186; 257/E21.051; 257/E21.32; 257/E21.127; 257/E21.147

(58) Field of Classification Search .................. 438/141, 438/148, 197, 311, 752, 763, 933; 257/E21.051, 257/E21.32, E21.127, E21.147
See application file for complete search history.

(56) References Cited

U.S. PATENT DOCUMENTS

| | | | |
|---|---|---|---|
| 6,008,099 A * | 12/1999 | Sultan et al. | 438/305 |
| 6,096,628 A * | 8/2000 | Greenlaw et al. | 438/530 |
| 6,706,614 B1 * | 3/2004 | An et al. | 438/429 |
| 6,756,637 B2 | 6/2004 | Adkisson et al. | |
| 6,943,407 B2 | 9/2005 | Ouyang et al. | |
| 7,205,604 B2 | 4/2007 | Ouyang et al. | |
| 2006/0172511 A1 | 8/2006 | Kammler et al. | |
| 2007/0290192 A1 | 12/2007 | Rotondaro | |

* cited by examiner

*Primary Examiner* — David Nhu
(74) *Attorney, Agent, or Firm* — Cantor Colburn LLP; Joseph Petrokaitis

(57) ABSTRACT

A semiconductor device includes a buried insulator layer formed on a bulk substrate; a first type semiconductor material formed on the buried insulator layer, and corresponding to a body region of a field effect transistor (FET); a second type of semiconductor material formed over the buried insulator layer, adjacent opposing sides of the body region, and corresponding to source and drain regions of the FET; the second type of semiconductor material having a different bandgap than the first type of semiconductor material; wherein a source side p/n junction of the FET is located substantially within whichever of the first and the second type of semiconductor material having a lower bandgap, and a drain side p/n junction of the FET is located substantially entirely within whichever of the first and the second type of semiconductor material having a higher bandgap.

11 Claims, 5 Drawing Sheets

ASYMMETRIC SOURCE/DRAIN JUNCTIONS FOR LOW POWER SILICON ON INSULATOR DEVICES

BACKGROUND

The present invention relates generally to semiconductor device manufacturing techniques and, more particularly, to asymmetric source/drain junctions for low power semiconductor-on-insulator (SOI) devices.

Demands for increased performance, functionality and manufacturing economy for integrated circuits have resulted in extreme integration density to reduce signal propagation time and increase noise immunity while increasing the number of circuits and devices that can be formed on a chip or wafer by a single sequence of processes. Scaling of devices to small sizes has also restricted operating margins and required increased uniformity of electrical characteristics of semiconductor devices on a chip.

To satisfy this latter criterion, semiconductor-on-insulator, or more specifically silicon-on-insulator (SOI) wafers have been used to exploit the improved quality of monocrystalline silicon provided thereby in an active layer formed on an insulator over a bulk silicon "handling" substrate. Similar attributes can be developed in similar structures of other semiconductor materials and alloys thereof. The improved quality of the semiconductor material of the active layer allows transistors and other devices to be scaled to extremely small sizes with good uniformity of electrical properties.

Unfortunately, the existence of the insulator layer that supports the development of the improved quality of semiconductor material also presents a problem known in the art as the floating body effect in transistor structures. The floating body effect is specific to transistors formed on substrates having an insulator layer. The neutral floating body is electrically isolated by source/drain and halo extension regions that form oppositely poled diode junctions at the ends of the transistor conduction channel and floating body while the gate electrode is insulated from the conduction channel through a dielectric. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The voltage developed due to charge collection in the transistor conduction channel has the effect of altering the switching threshold of the transistor. This effect, in turn, alters the signal timing and signal propagation speed since any transistor will have a finite slew rate and the rise and fall time of signals is not instantaneous even when gate capacitance is very small. Therefore, the diode characteristics of the source and drain must be tailored to limit charge build-up in the floating body.

To do so, the diode junctions may be made somewhat leaky to allow the floating body of the transistor to be discharged to an acceptable degree. However, since field effect transistors are generally formed symmetrically with identical source and drain impurity structures, development of such a characteristic reduces the ratio of resistance of the "on" and "off" states of the transistor, often referred to as the on/off ratio. A large on/off ratio is desirable to support maximum circuit fan out (the number of transistor gates a transistor can drive with acceptable switching speed) and to provide maximum signal voltage swing close to the power supply voltage. Therefore, there is a trade-off between limitation of floating body effects and maintaining a suitable on/off ratio. In addition, leaky junctions, particularly on the drain side, significantly increase leakage current and therefore total power consumption.

BRIEF SUMMARY

In an exemplary embodiment, a semiconductor device includes a buried insulator layer formed on a bulk substrate; a first type semiconductor material formed on the buried insulator layer, and corresponding to a body region of a field effect transistor (FET); a second type of semiconductor material formed over the buried insulator layer, adjacent opposing sides of the body region, and corresponding to source and drain regions of the FET; the second type of semiconductor material having a different bandgap than the first type of semiconductor material; wherein a source side p/n junction of the FET is located substantially within whichever of the first and the second type of semiconductor material having a lower bandgap, and a drain side p/n junction of the FET is located substantially entirely within whichever of the first and the second type of semiconductor material having a higher bandgap.

In another embodiment, a method of forming asymmetric p/n junctions in a field effect transistor (FET) device includes performing an angled dopant implant for the FET device, the FET device having a buried insulator layer formed on a bulk substrate, a first type semiconductor material formed on the buried insulator layer, and corresponding to a body region of the FET device, a second type of semiconductor material formed over the buried insulator layer, adjacent opposing sides of the body region, and corresponding to source and drain regions of the FET, device the second type of semiconductor material having a different bandgap than the first type of semiconductor material; wherein a source side p/n junction of the FET device is located substantially within whichever of the first and the second type of semiconductor material having a lower bandgap, and a drain side p/n junction of the FET device is located substantially entirely within whichever of the first and the second type of semiconductor material having a higher bandgap.

In another embodiment, a method of forming a field effect transistor (FET) device includes forming a buried insulator on a bulk substrate; forming a first type of semiconductor material on the buried insulator layer; removing portions of the first type of semiconductor material corresponding to source and drain regions of the FET device, and leaving a portion of the first type of semiconductor material corresponding to a body region of the FET device; forming a second type of semiconductor material over the buried insulator layer, corresponding to the source and drain regions of the FET device, the second type of semiconductor material having a different bandgap than the first type of semiconductor material; and performing an angled dopant implant such that a source side p/n junction of the FET device is located substantially within whichever of the first and the second type of semiconductor material having a lower bandgap, and a drain side p/n junction of the FET is located substantially entirely within whichever of the first and the second type of semiconductor material having a higher bandgap.

BRIEF DESCRIPTION OF THE SEVERAL VIEWS OF THE DRAWINGS

Referring to the exemplary drawings wherein like elements are numbered alike in the several Figures.

DETAILED DESCRIPTION

Disclosed herein is an asymmetric junction structure for FET devices formed on SOI substrates. In brief, the embodiments utilize a first type of semiconductor material for the body region and a second type of semiconductor material for the source and drain regions, wherein the source/drain semiconductor material has a different bandgap than the body material. This structure is combined with an angled dopant implantation step (or, alternatively, a combination of a vertical and angled dopant implantation steps), such that the p/n junction on the source side of the transistor is substantially defined within the lower bandgap material, while the p/n junction on the drain side of the transistor is defined substantially entirely within the higher bandgap material. As a result, the device provides adequate leakage on the source side to address floating body effects, while also avoiding significant leakage on the drain side to reduce power consumption.

As indicated above, the floating body effect is a significant drawback of SOI device structures. One approach to reduce floating body effects is to make the p/n junctions leaky. However, by making the junction leaky, particularly on drain side, the leakage current (and thus total power consumption) is significantly increased. Accordingly, in the exemplary embodiments described herein, a novel method is used to make asymmetric junctions with respect to the source and drain sides of the transistor by an angled ion implantation (I/I) or, alternatively, using both an angled I/I and a direct (vertical) I/I of dopant material. This is combined with using the properties of a different semiconductor material for the source/drain regions with respect to the body. One particularly advantageous combination is to use silicon germanium (SiGe) for the source/drain regions and silicon (Si) for the initial SOI layer that comprises the transistor body.

In particular, embedded SiGe (or eSiGe as known in the art) has been used in p-type MOSFETs (PFETs). Because SiGe has a lower bandgap than Si, this results in higher junction leakage current. Although the exemplary description presented below depicts a PFET device using P+ type dopants (e.g., boron), it should be understood that the principles discussed herein are equally applicable to NFETs, as well as to other semiconductor materials of different bandgaps.

Figure 1A:
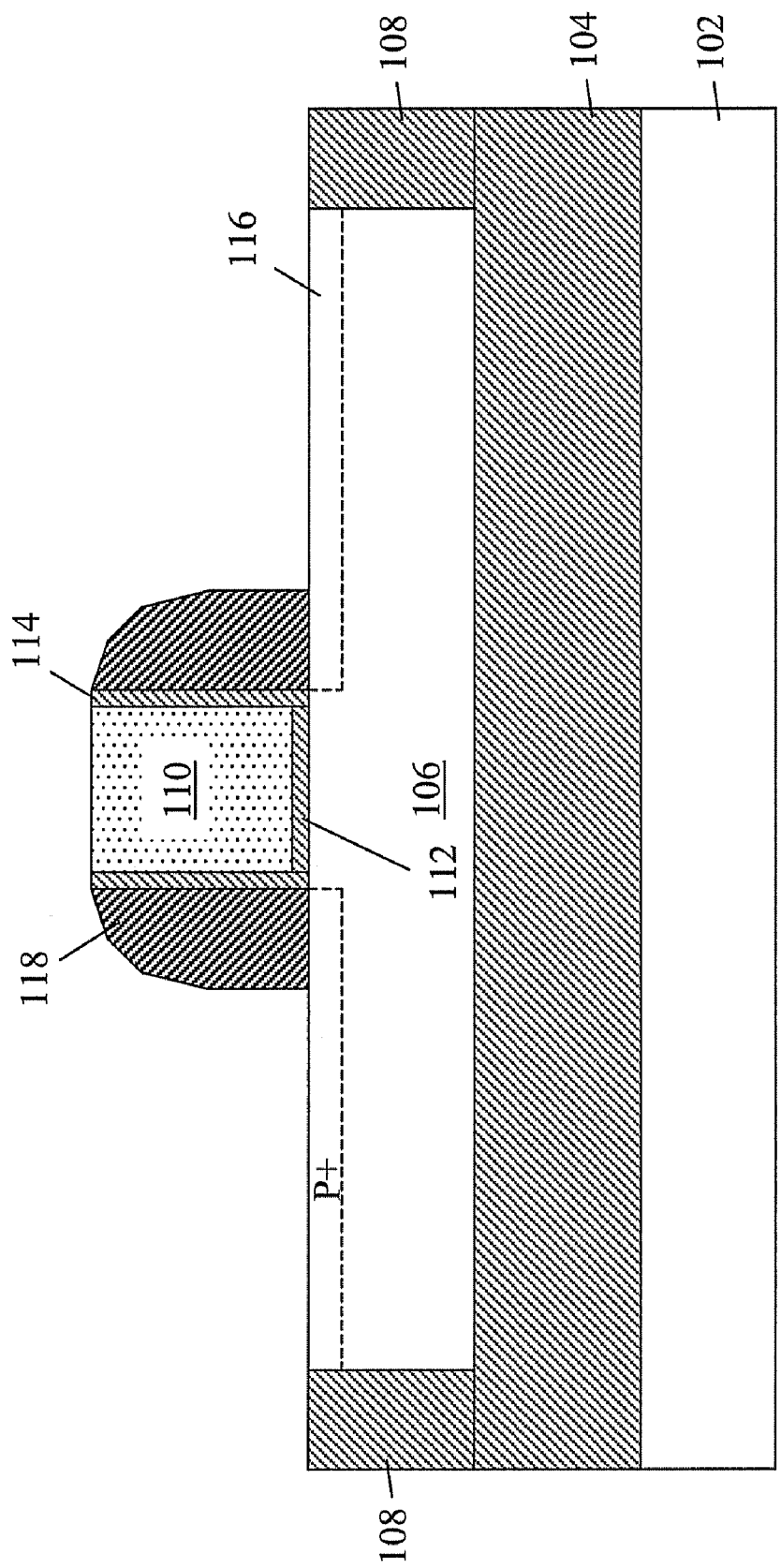
FIGS. 1(a) through 1(e) are a series of cross sectional views illustrating a method of forming an asymmetric junction structure for FET devices on SOI substrates, in accordance with an embodiment of the invention.

Referring initially to FIG. 1(a), there is shown a cross-sectional view of an exemplary transistor device to which the asymmetric p/n junction technique may be applied. As is shown, a bulk substrate 102 (e.g., Si) has a buried insulator or oxide (BOX) layer 104 formed thereon, with an SOI (e.g., Si) layer 106 formed on the BOX layer 104. As is also known in the art, one or more shallow trench isolation (STI) regions 108 (e.g., oxide) are also used to electrically isolate transistors from one another.

As further shown in FIG. 1(a), a gate structure is formed over the SOI layer 106, the gate structure including a gate conductor 110 (e.g., polysilicon) formed over a gate insulating or dielectric layer 112 (e.g., oxide). The gate structure has a first set of sidewall spacers 114 (e.g., oxide) formed thereon, which may be used to define the locations of shallow source/drain extension regions 116. Again, in the exemplary PFET embodiment, the extension regions would be formed by implantation of a P+type dopant material, such as boron for example. A second set of sidewall spacers 118 (e.g., nitride) are then formed on the gate structure, and eventually define the deep source and drain regions of the device.

Figure 1B:
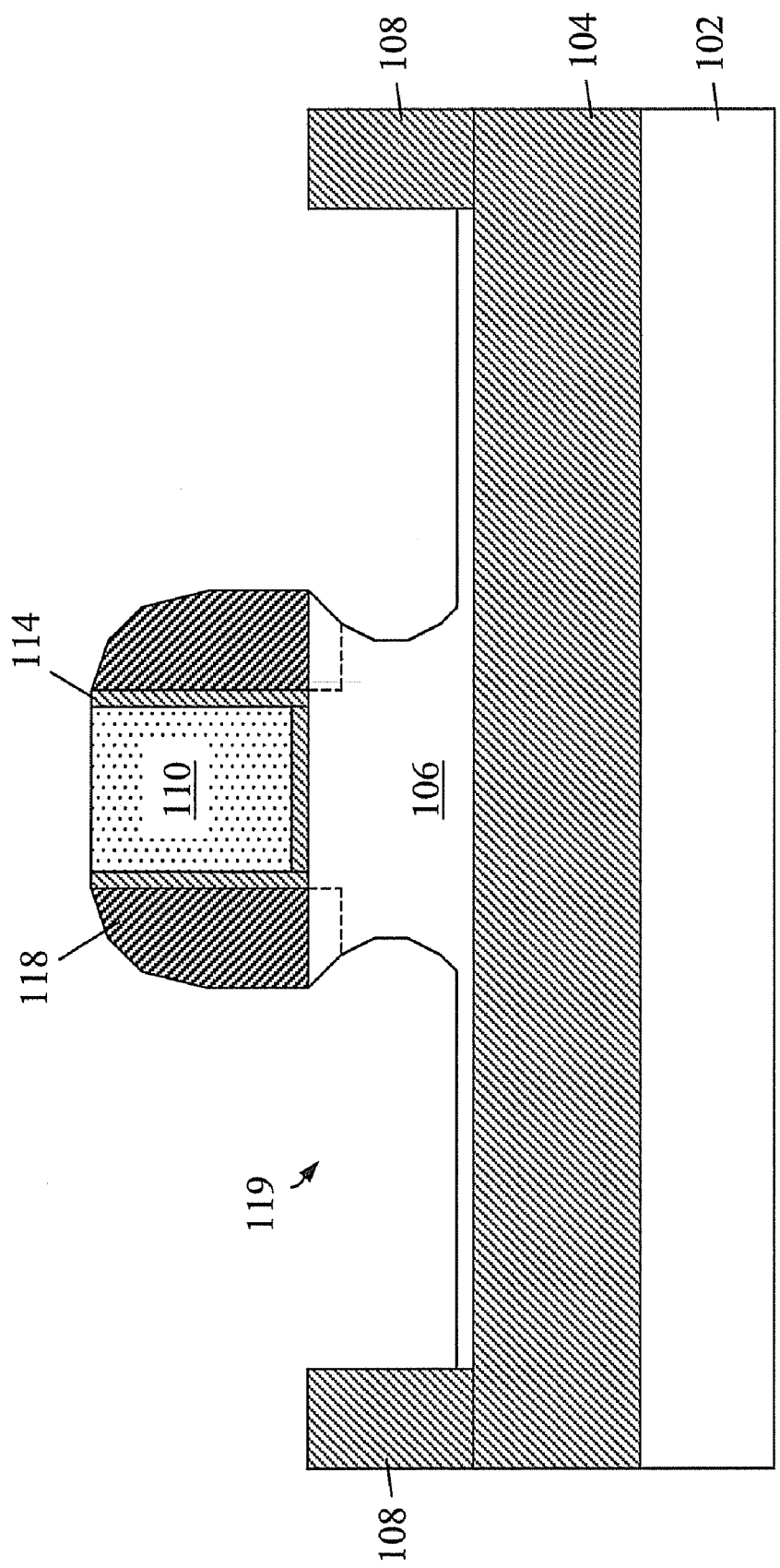
Figure 1C:
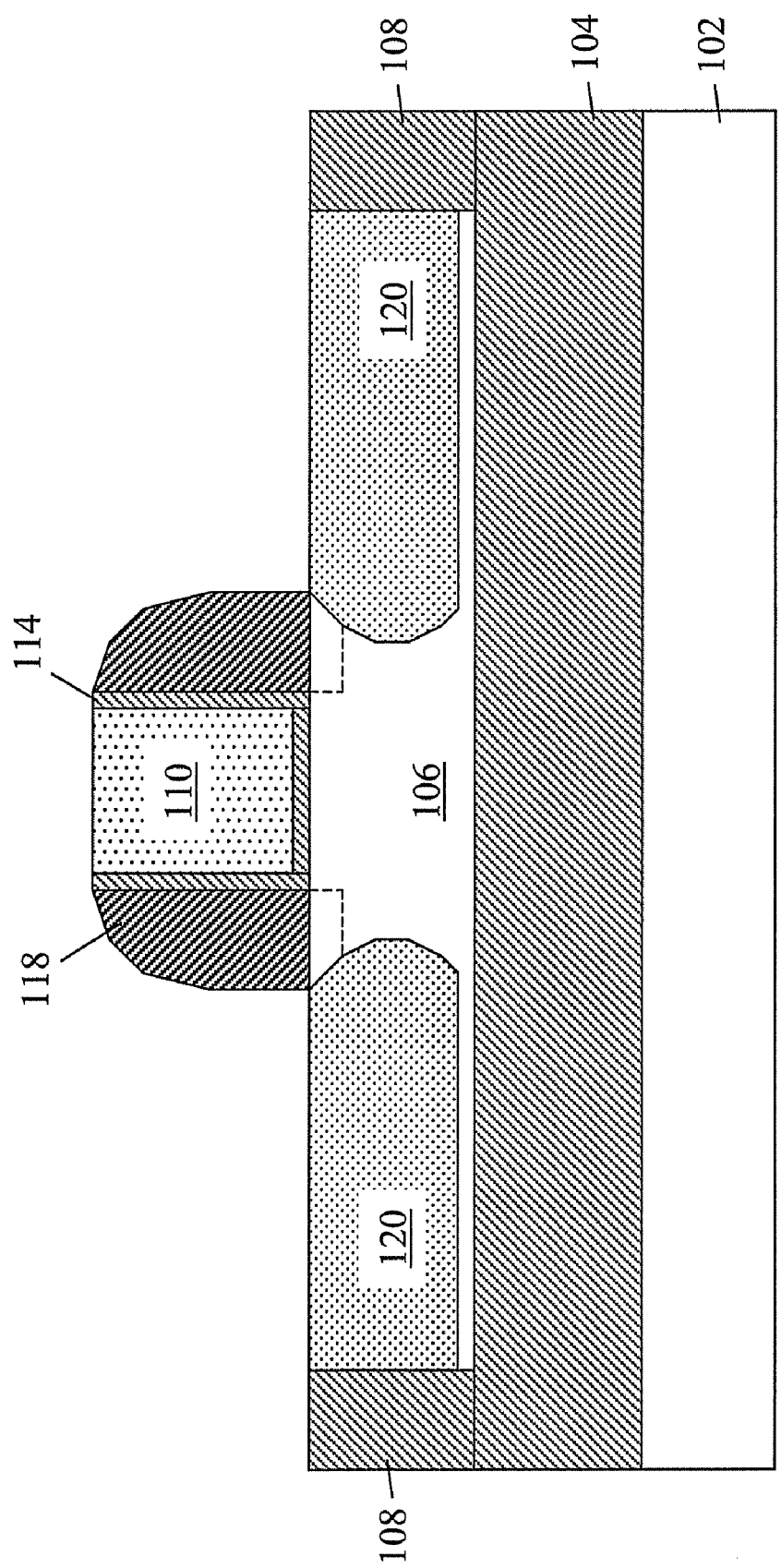

Referring now to FIG. 1(b), the portions of the SOI material 106 corresponding to the source and drain regions are substantially entirely removed, such as by etching of the silicon. As a practical matter, there may be a thin layer of SOI material 106 remaining on top of the BOX layer 104 in the source/drain regions (e.g., about 500 angstroms (Å) or less), thereby forming recesses 119. Notably, the recesses 119 are also somewhat laterally etched inward toward the channel of the device. Then, as shown in FIG. 1(c), embedded silicon germanium (eSiGe) regions 120 are epitaxially grown on the SOI material 106 within the recesses, so as to define source and drain regions having a different bandgap material than the SOI body material 106.

Figure 1D:
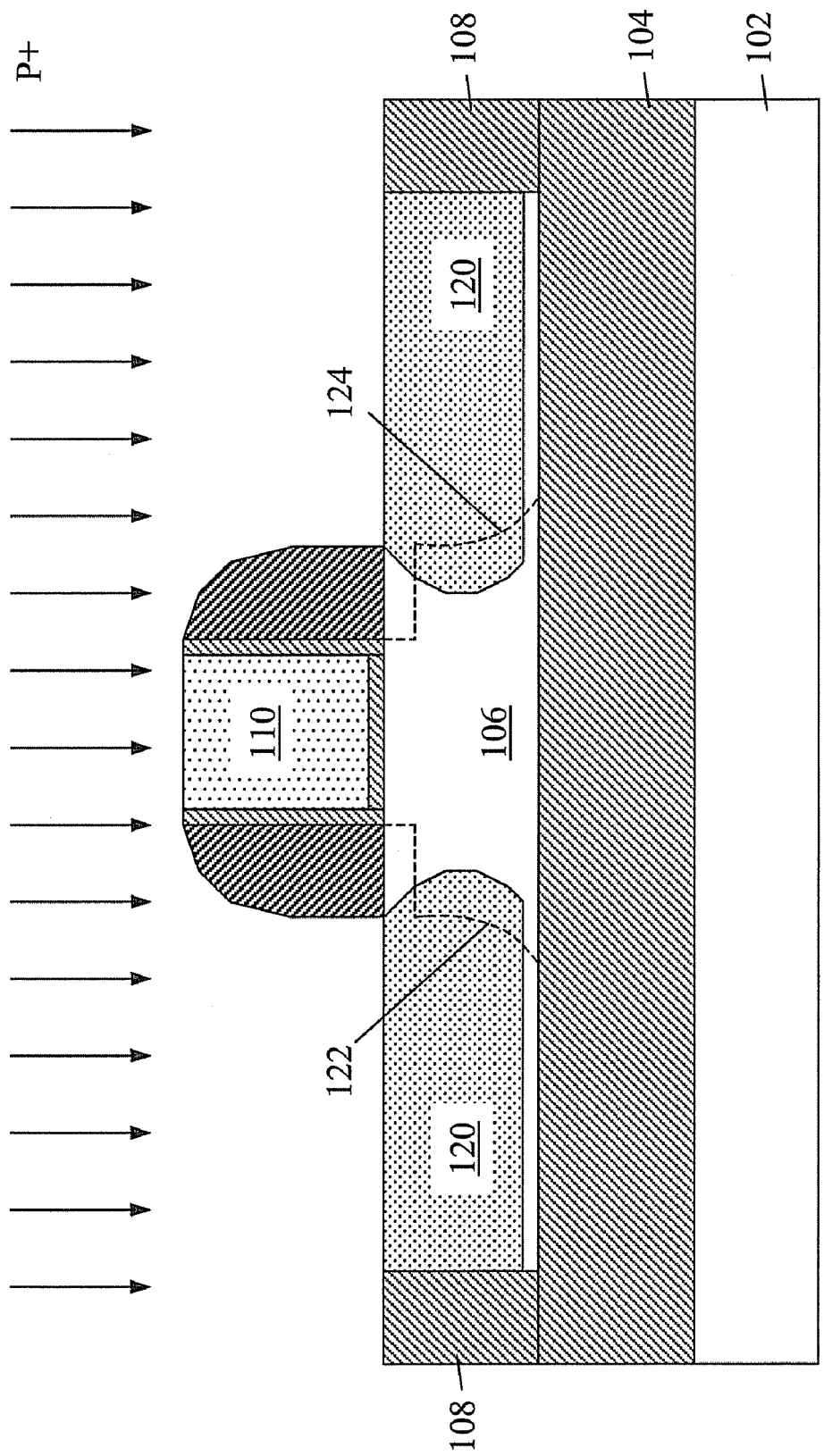
Figure 1E:
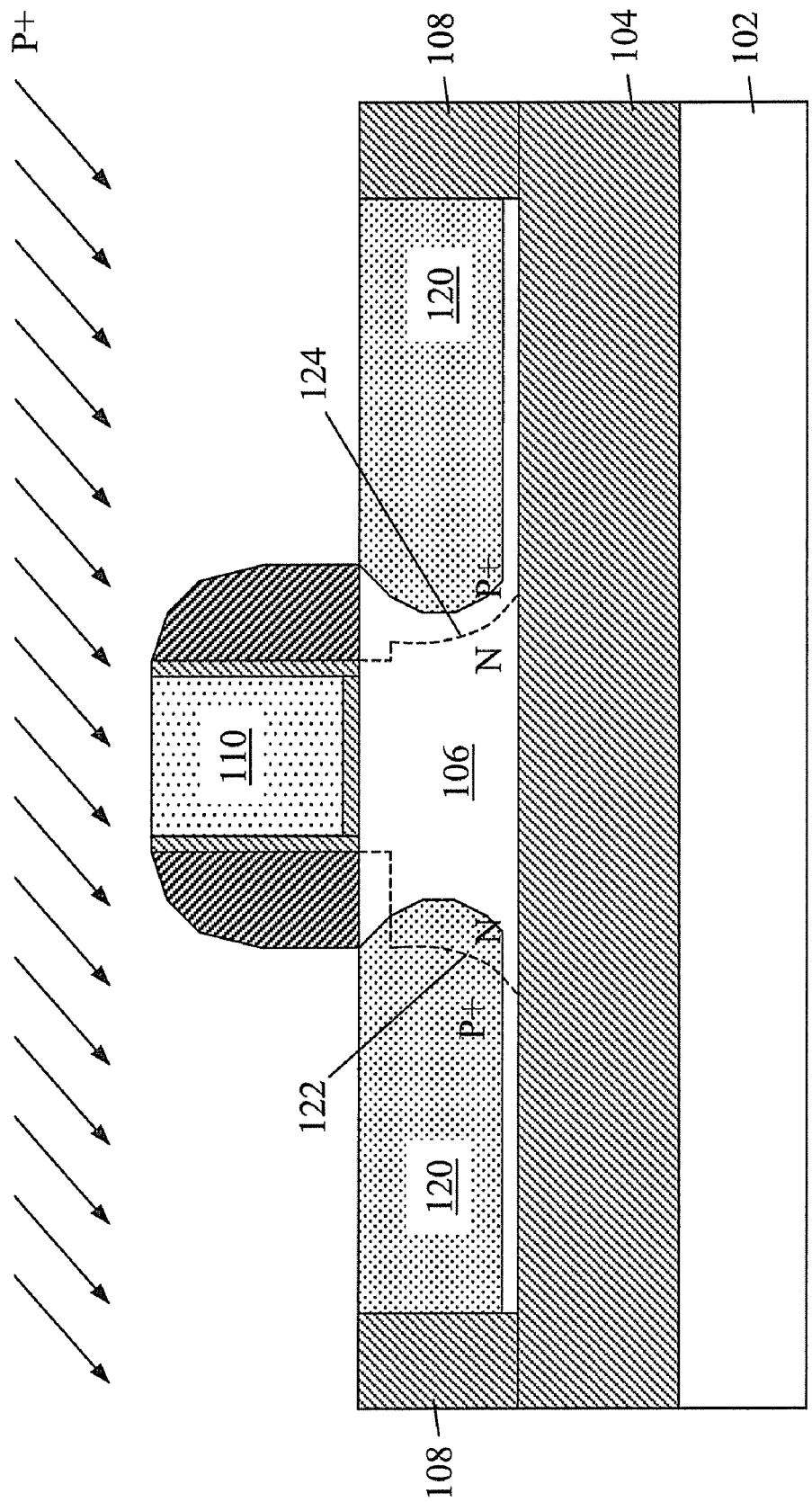

As indicated above, the substrate may then be subjected to either an angled dopant implant alone or a combination of vertical and angled dopant implants. In the latter case, either the vertical dopant implant or the angled dopant implant may be performed first. For purposes of illustration, the present example first depicts a vertical implant is shown in FIG. 1(d). Where the vertical P+ implant is performed first, it will be noted that the source side P+/N junction 122 is initially symmetrical with the drain side P+/N junction 124, in that they are both substantially located (at this point) in the lower bandgap SiGe material 120. However, as also mentioned previously, this leaky configuration on the drain side of the transistor leads to larger leakage current and higher power consumption. Accordingly, as shown in FIG. 1(e), an angled implant is also performed so as to push the drain side P+/N junction 124 beyond the SiGe material 120 and substantially entirely into the lower bandgap body material 106, thereby defining a PFET with asymmetric p/n junctions.

In the exemplary embodiment depicted, the SiGe source/drain material 120 has a lower bandgap than the silicon body material 106. However, in the event different materials semiconductor are desired, the source and drain region locations may be reversed with respect to the location of the asymmetric p/n junctions. For example, if the body region material 106 were to have a lower bandgap than the source/drain material 120, then P+/N junction 124 (being in the lower bandgap material) would now represent the source side junction and the P+/N junction 122 (being in the higher bandgap material) would now represent the drain side junction.

Thus configured, the transistor device avoids the significant leakage through the drain side at high drain bias voltages, and injection of electrons into the body, while also having an adequate leakage junction on the source side for achieving floating body effect reduction.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming asymmetric p/n junctions in a field effect transistor (FET) device, comprising:
   performing an angled dopant implant for the FET device, the FET device having a buried insulator layer formed on a bulk substrate, a first type semiconductor material formed on the buried insulator layer, and corresponding to a body region of the FET device, a second type of semiconductor material formed over the buried insulator layer, adjacent opposing sides of the body region, and corresponding to source and drain regions of the FET device, the second type of semiconductor material having a different bandgap than the first type of semiconductor material;

wherein a source side p/n junction of the FET device is located substantially within whichever of the first and the second type of semiconductor material having a lower bandgap, and a drain side p/n junction of the FET device is located substantially entirely within whichever of the first and the second type of semiconductor material having a higher bandgap.

2. The method of forming asymmetric p/n junctions in an FET device according to claim 1, wherein the first type of semiconductor material has a higher bandgap than the second type of semiconductor material.

3. The method of forming asymmetric p/n junctions in an FET device according to claim 2, wherein the first type of semiconductor material comprises silicon and the second type of semiconductor material comprises silicon germanium.

4. The method of forming asymmetric p/n junctions in an FET device according to claim 1, wherein the first type of semiconductor material has a lower bandgap than the second type of semiconductor material.

5. The method of forming asymmetric p/n junctions in an FET device according to claim 1, wherein the FET device comprises a PFET device.

6. A method of forming a field effect transistor (FET) device, comprising:

forming a buried insulator on a bulk substrate;

forming a first type of semiconductor material on the buried insulator layer;

removing portions of the first type of semiconductor material corresponding to source and drain regions of the FET device, and leaving a portion of the first type of semiconductor material corresponding to a body region of the FET device;

forming a second type of semiconductor material over the buried insulator layer, corresponding to the source and drain regions of the FET device, the second type of semiconductor material having a different bandgap than the first type of semiconductor material; and performing an angled dopant implant such that a source side p/n junction of the FET device is located substantially within whichever of the first and the second type of semiconductor material having a lower bandgap, and a drain side p/n junction of the FET is located substantially entirely within whichever of the first and the second type of semiconductor material having a higher bandgap.

7. The method of forming an FET device according to claim 6, wherein the first type of semiconductor material has a higher bandgap than the second type of semiconductor material.

8. The method of forming an FET device according to claim 7, wherein the first type of semiconductor material comprises silicon and the second type of semiconductor material comprises silicon germanium.

9. The method of forming an FET device according to claim 6, wherein the first type of semiconductor material has a lower bandgap than the second type of semiconductor material.

10. The method of forming an FET device according to claim 6, wherein the FET device comprises a PFET device.

11. The method of forming an FET device according to claim 6, further comprising performing a vertical dopant implant.

* * * * *